(12) United States Patent
Kang et al.

(10) Patent No.: US 7,315,319 B2
(45) Date of Patent: Jan. 1, 2008

(54) LASER INDUCED THERMAL IMAGING APPARATUS, LASER INDUCED THERMAL IMAGING METHOD USING THE APPARATUS, AND METHOD OF FABRICATING ORGANIC LIGHT EMITTING DISPLAY USING THE APPARATUS

(75) Inventors: Tae-Min Kang, Suwon-si (KR); Jae-Ho Lee, Suwon-si (KR); Seong-Taek Lee, Suwon-si (KR); Jin-Soo Kim, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 216 days.

(21) Appl. No.: 11/020,668

(22) Filed: Dec. 27, 2004

(65) Prior Publication Data

US 2006/0132589 A1    Jun. 22, 2006

(30) Foreign Application Priority Data

Dec. 20, 2004    (KR) .................... 10-2004-0108992

(51) Int. Cl.
*B41J 2/435*    (2006.01)
(52) U.S. Cl. ..................... 347/224; 430/200
(58) Field of Classification Search ........... 347/171, 347/224, 262, 264; 430/200
See application file for complete search history.

(56) References Cited

U.S. PATENT DOCUMENTS

| 5,904,961 | A | 5/1999 | Tang et al. |
|---|---|---|---|
| 5,998,085 | A | 12/1999 | Isberg et al. |
| 6,114,088 | A | 9/2000 | Wolk et al. |
| 6,214,520 | B1 | 4/2001 | Wolk et al. |
| 6,226,020 | B1 | 5/2001 | Schuster et al. |
| 6,476,842 | B1 | 11/2002 | Chang |
| 6,566,032 | B1 * | 5/2003 | Boroson et al. ............ 430/200 |
| 6,695,029 | B2 * | 2/2004 | Phillips et al. ............. 156/540 |
| 6,695,030 | B1 * | 2/2004 | Phillips et al. ............. 156/540 |

FOREIGN PATENT DOCUMENTS

| CN | 1424777 | 6/2003 |
|---|---|---|
| CN | 1485218 | 3/2004 |
| DE | 19811031 | 9/1999 |
| EP | 1335637 | 8/2003 |
| EP | 1344652 | 9/2003 |
| EP | 1394872 | 3/2004 |
| JP | 11-314388 | 11/1999 |

* cited by examiner

*Primary Examiner*—Huan Tran
(74) *Attorney, Agent, or Firm*—H.C. Park & Associates, PLC

(57) ABSTRACT

A laser induced thermal imaging apparatus, and a laser induced thermal imaging method and a method of fabricating an organic light emitting display using the apparatus are provided. The laser induced thermal imaging apparatus includes a chuck for fixing an acceptor substrate. A lamination unit for laminating a donor film on the acceptor substrate is located on the chuck. The lamination unit includes a body having a cavity, a gas injection port for injecting a compression gas into the cavity and a gas discharge port for discharging the gas injected into the cavity onto the substrate. A laser irradiator for irradiating a laser beam on the laminated donor film through the lamination unit is located on the lamination unit.

53 Claims, 15 Drawing Sheets

LASER INDUCED THERMAL IMAGING APPARATUS, LASER INDUCED THERMAL IMAGING METHOD USING THE APPARATUS, AND METHOD OF FABRICATING ORGANIC LIGHT EMITTING DISPLAY USING THE APPARATUS

CROSS-REFERENCE TO RELATED APPLICATION

This application claims priority to and the benefit of Korean Patent Application No. 2004-108992, filed Dec. 20, 2004, the disclosure of which is incorporated herein by reference in its entirety.

BACKGROUND OF THE INVENTION

1. Field of the Invention

The present invention relates to a laser induced thermal imaging apparatus and, more particularly, to a laser induced thermal imaging apparatus capable of simultaneously performing lamination and laser irradiation, and a laser induced thermal imaging method using the apparatus.

2. Description of the Related Art

In general, a laser induced thermal imaging (LITI) method requires at least a laser, an acceptor substrate, and a donor film. The donor film includes a base film, a light-heat conversion layer and a transfer layer. In an LITI process, the transfer layer is disposed opposite to the acceptor substrate to laminate the donor film on an entire surface of the acceptor substrate, and then to irradiate a laser beam on the base film. The beam irradiated on the base film is absorbed into the light-heat conversion layer to be converted into heat energy, and the transfer layer is transferred on the acceptor substrate by the heat energy. As a result, a transfer layer pattern is formed on the acceptor substrate. This is disclosed in U.S. Pat. Nos. 5,998,085, 6,214,520 and 6,114,088.

However, when the donor film is laminated on the entire surface of the acceptor substrate as described above, bubbles may locally remain between the acceptor substrate and the donor film. These bubbles may cause transfer failures.

In order to solve the problem, U.S. Pat. No. 6,226,020 discloses a method and apparatus for producing a print by means of laser induced thermal transfer. In accordance with '020 patent, a pattern is formed on the substrate by contacting a transfer tape having a width smaller than that of the substrate on the substrate provided on a substrate cylinder, and irradiating a laser beam on the transfer tape. At this time, contacting the transfer tape on the substrate is performed using a contact roll adjacent to the substrate. Additionally, a nozzle is disposed in a direction inclined to the laser beam, and a gas is ejected on the transfer tape using the nozzle to improve contact force between the transfer tape and the substrate.

Specifically, the contact roll functions to allow the transfer tape to surround the substrate cylinder with a predetermined wrap angle, and the wrap angle may form contact force and friction force between the transfer tape and the substrate on the substrate cylinder. However, when the transfer layer of the transfer tape is an organic layer, the friction force generated as described above is sufficient to damage the organic layer.

In addition, the nozzle is disposed in the direction inclined to the laser beam, since a distance between the nozzle and the substrate is too far, it may be difficult to obtain sufficient contact force between the transfer tape and the substrate using only the nozzle. In this case, in order to obtain the sufficient contact force, the nozzle should eject a plenty of high-pressure gas on the transfer tape. In particular, differently from '020 patent, when the substrate is not wound on the cylinder but located on a plane surface and the transfer tape and the substrate should be closely adhered to each other using only the gas pressure ejected from the nozzle without the contact roll, it may be more difficult to sufficiently obtain uniform contact force all over a predetermined region due to the far distance.

SUMMARY OF THE INVENTION

The present invention, therefore, solves aforementioned problems associated with conventional devices by providing a laser induced thermal imaging apparatus and a laser induced thermal imaging method using the apparatus capable of obtaining sufficient contact force between a donor film and an acceptor substrate without generating friction force between a transfer layer of the donor film and the acceptor substrate.

In an exemplary embodiment of the present invention, a laser induced thermal imaging apparatus is provided. The laser induced thermal imaging apparatus includes a chuck for fixing an acceptor substrate. A lamination unit for laminating a donor film on the acceptor substrate is located on the chuck. The lamination unit includes a body having a cavity, a gas injection port for injecting a compression gas into the cavity, and a gas discharge port for discharging the gas injected into the cavity onto the substrate. A laser irradiator for irradiating a laser beam on the laminated donor film through the lamination unit is located on the lamination unit. As a result, the laser beam may be irradiated on the donor film sufficiently laminated by means of the lamination unit. In addition, since the lamination unit performs a lamination process using gas ejection, it is possible to form a uniform gap between the body and the donor film, and the gap enables the lamination unit to move without direct friction when the lamination unit moves on the donor film.

The lamination unit may be installed at an upper portion of the body, and may include a light transmission window in contact with the cavity. In this case, the gas injection port may pass through a sidewall of the body. At this time, the laser beam may be irradiated on the donor film through the light transmission window, the cavity, and the gas discharge port.

The gas injection port may pass through an upper portion of the lamination unit body, and the gas discharge port may pass through a lower portion of the lamination unit body. At this time, the laser beam may be irradiated on the donor film through the gas injection port, the cavity, and the gas discharge port.

The lamination unit may further include an exhaust port for exhausting gas discharged in the chuck at an outer periphery of the body. The exhaust port may be connected to an exhaust pump.

The apparatus may further include a guide roll for contacting the donor film on the acceptor substrate to at least one side of the lamination unit. As a result, it is possible to more effectively laminate the donor film on the acceptor substrate.

Preferably, the laser irradiator and the lamination unit are simultaneously movable in a Y-direction crossing the chuck. On the other hand, in another embodiment of the present invention, the lamination unit may have a line shape extending the Y-direction crossing the chuck. In this case, the laser irradiator may irradiate a laser as moving in the Y-direction along the lamination unit.

The donor film may have a ribbon shape. The ribbon-shaped donor film may include protrusions at both edges thereof. In addition, the laser induced thermal imaging apparatus may further include film supply means at one side of the lamination unit, and film winding means at the other side of lamination unit. Further, preferably, the laser irradiator, the lamination unit, the film supply means and the film winding means are simultaneously movable in the Y-direction crossing the chuck.

The donor film may be located on an entire surface of the acceptor substrate. In this case, at least two corners of the donor film are preferably attached to a frame. Furthermore, the chuck may fix the frame.

In another exemplary embodiment of the present invention, a laser induced thermal imaging method is provided. The method includes locating an acceptor substrate on a chuck. A donor film including at least a light;heat conversion layer and a transfer layer is located to make the transfer layer opposite to the lower substrate. A portion of the donor film is locally laminated on the acceptor substrate using the lamination unit, and simultaneously, the laser is irradiated on the laminated donor film through the lamination unit to transfer at least a portion of the transfer layer on the acceptor substrate. As a result, the laser beam may be irradiated on the donor film sufficiently laminated by means of the lamination unit.

Further, the lamination unit may perform a lamination process using air pressure. As a result, since the lamination unit performs the lamination process using gas discharge, it is possible to make a uniform gap between the body and the donor film, and the gap enables to allow the lamination unit to move without direct friction when the lamination unit moves on the donor film.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
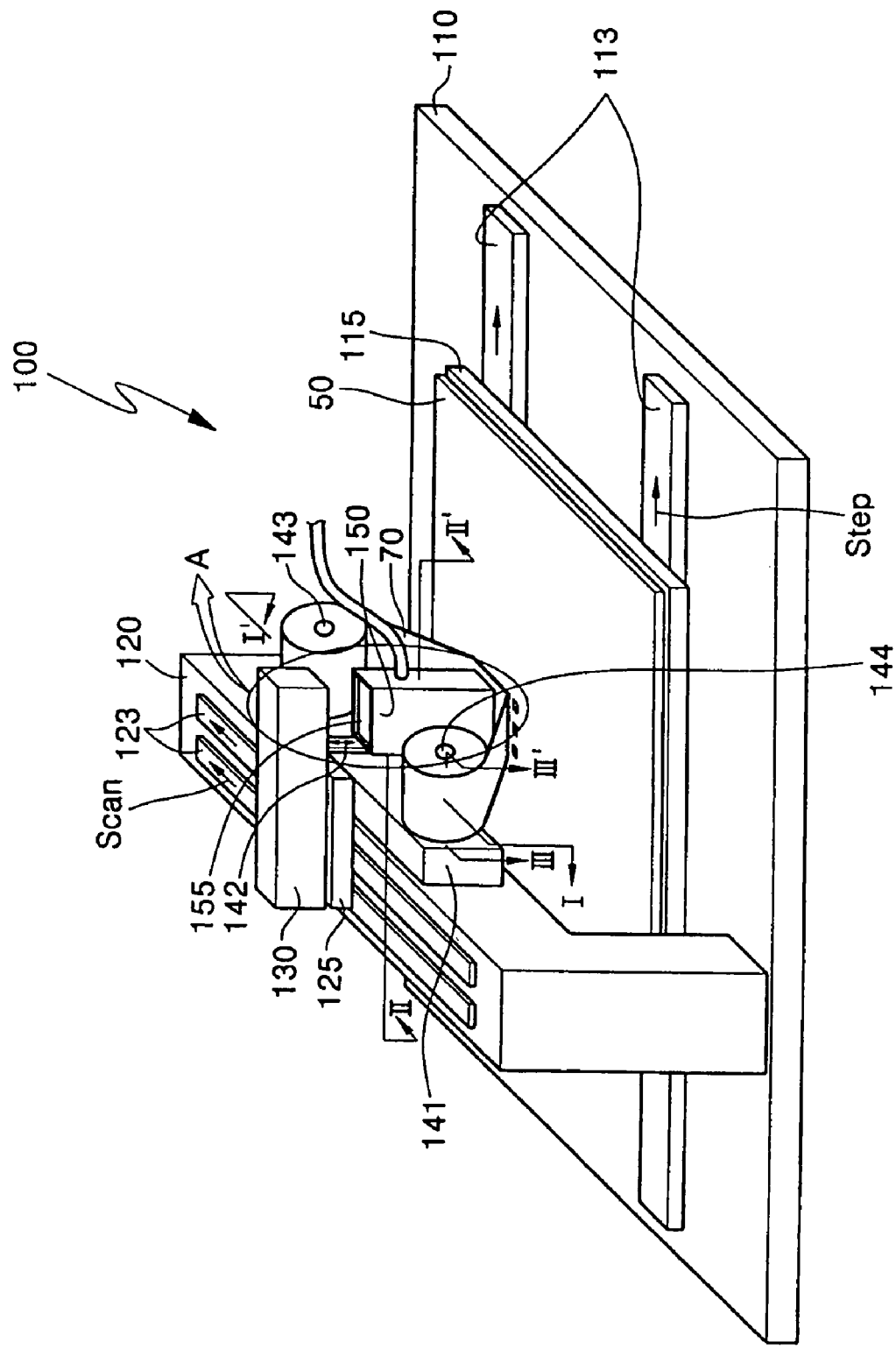
FIG. 1 is a schematic perspective view of a laser induced thermal imaging apparatus in accordance with an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. In the drawings, when it is described that a layer is existed "on" another layer or a substrate, the layer may be directly formed on another layer or a substrate, or a third layer may be interposed between them. Like reference numerals designate like elements throughout the specification.

Figure 2:
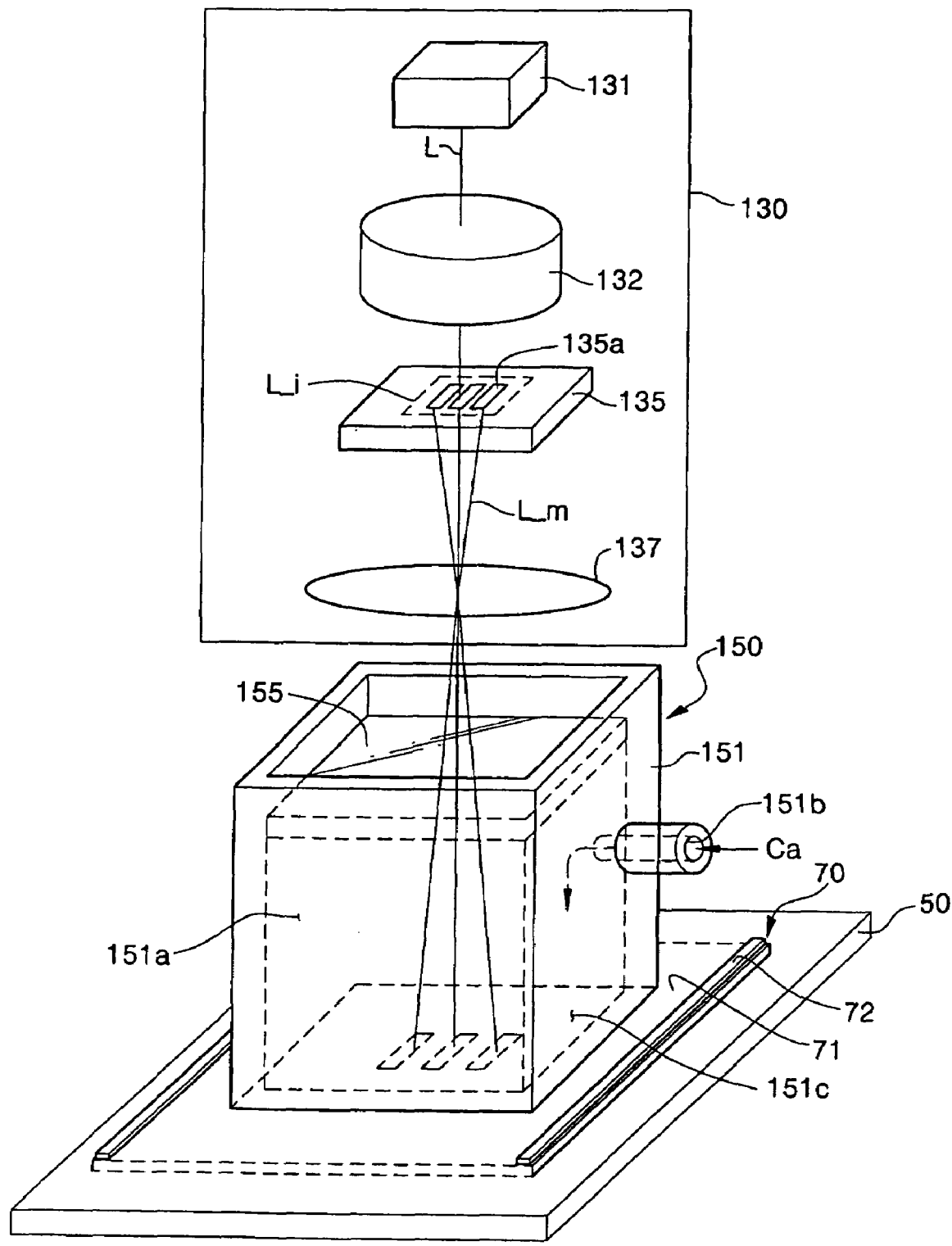
FIG. 2 is an enlarged perspective view of A-portion shown in FIG. 1.

FIG. 1 is a schematic perspective view of a laser induced thermal imaging apparatus in accordance with an embodiment of the present invention, and FIG. 2 is an enlarged perspective view of A-portion shown in FIG. 1.

Referring to FIGS. 1 and 2, a laser induced thermal imaging apparatus 100 includes a substrate stage 110. A chuck 115 is located on the substrate stage 110. The substrate stage 110 includes a chuck guide bar 113 for moving the chuck 115 in an X-direction. Therefore, the chuck 115 is movable along the chuck guide bar 113 in the X-direction. The chuck 115 fixes an acceptor substrate 50 to be located on the chuck 115.

An optical stage 120 disposed in a direction crossing the chuck 115 is located on the chuck 115. A laser irradiator 130 is installed on the optical stage 120. The laser irradiator 130 may include a light source 131, a beam shaping element 132, a mask 135, and a projection lens 137. The light source 131 is an apparatus for generating a laser beam L. The laser beam L generated from the light source 131 passes through the beam shaping element 132. The beam shaping element 132 may deform a beam having a Gaussian profile generated in the light source 131 to a beam L_i having a homogenized flat-top profile. The homogenized beam L_i may pass through the mask 135. The mask 135 includes at least one light transmission pattern or at least one light reflection pattern. While only the light transmission patterns 135a are shown in the drawings, it is not limited thereto. The beam passed through the mask 135 may have an image L_m patterned by the patterns 135a. The beam having the patterned image L_m passes through the projection lens 137.

The optical stage 120 includes a laser guide bar 123 for moving the laser irradiator 130 in a Y-direction. Further, the laser irradiator 130 is mounted on a top surface of the optical stage 120, specifically on the laser guide bar 123 through a laser irradiator base 125.

A lamination unit 150 is mounted on a side of the optical stage 120. The lamination unit 150 is an element for locally laminating a donor film 70 on the acceptor substrate 50. The laser irradiator 130 is located on the lamination unit 150. The laser irradiator 130 irradiates a laser beam passed through the projection lens 137 on the lamination unit 150. The lamination unit has a light transmission part in a passage through which the laser beam is passed. Therefore, the laser beam may be irradiated on the laminated donor film 70 through the lamination unit 150, specifically, through the light transmission part of the lamination unit 150. As a result, a laser induced thermal imaging process may be performed together with the lamination. In addition, since the lamination is locally performed, although bubbles are generated between the acceptor substrate 50 and the donor film 70 of the laminated part, the bubbles may escape through between the donor film 70 and the acceptor substrate 50 of the non-laminated part located at a periphery portion. Eventually, it is possible to prevent transfer failures due to the bubbles. Further, as the laser beam is irradiated through the lamination unit 150, the laser beam may be irradiated on a portion where the lamination is sufficiently performed. As a result, it is possible to obtain an excellent transfer pattern profile.

The lamination unit 150 may be an apparatus for performing the lamination using air pressure. Specifically, the lamination unit 150 may include a body 151 having a cavity 151a, a gas injection port 151b for injecting a compression gas Ca into the cavity 151a, and a gas discharge port 151c for discharging the gas injected into the cavity 151a onto the chuck. The donor film 70 may be laminated on the acceptor substrate 50 by the pressure of the compression gas Ca, and the gas discharged through the gas discharge port 151c is exhausted to the exterior of the lamination unit 150, thereby forming a predetermined gap between the body 151 and the donor film 70.

The lamination unit 150 may include a light transmission window 155 installed at an upper portion of the body 151, which may be in contact with the cavity 151a. In this case, the laser irradiated from the laser irradiator 130 may be irradiated on the donor film 70 through the light transmission window 155, the cavity 151a, and the gas discharge port 151c. Therefore, the light transmission window 155, the cavity 151a and the gas discharge port 151c may constitute a light transmission part. At this time, the gas injection port 151b may be installed to pass through a sidewall of the body 151. The body 151 of the lamination unit 150 has a hexahedron shape as shown in figure, but it is not limited thereto, it may be a circular cylinder shape.

The donor film 70 may have a ribbon shape. Since the ribbon-shaped donor film 70 has a width smaller than that of the acceptor substrate 50, it is easy to obtain uniformity in manufacturing the film in comparison with the case of manufacturing the donor film having a width similar to or larger than that of the substrate 50. In this case, film supply means 143 may be installed at one side of the lamination unit 150, and film winding means 144 may be installed at the other side of the lamination unit 150. Preferably, the film supply means 143 and the film winding means 144 have roll shapes. The film supply means 143 and the film winding means 144 may apply a certain tension to the donor film 70.

The lamination unit 150 and the laser irradiator 130 are simultaneously movable in a Y-direction being a moving direction of the laser irradiator 130. As an example for implementing this, the lamination unit 150 is installed at a lamination unit base 141, and the lamination unit base 141 may be connected to the laser irradiator base 125. As a result, when the laser irradiator base 125 is moved in the Y-direction, the laser irradiator 130 installed on the laser irradiator base 125 and the lamination unit base 141 may be also moved in the Y-direction. Eventually, the lamination unit 150 installed at the lamination unit base 141 may be also moved in the Y-direction.

Further, preferably, the film supply means 143 and the film winding means 144 are simultaneously movable in the Y-direction together with the lamination unit 150. As an example for implementing this, the film supply means 143 and the film winding means 144 may be individually installed at the lamination unit base 141 to be spaced apart form the lamination unit 150. Therefore, the laser irradiator 130, the lamination unit 150, the film supply means 143 and the film winding means 144 are simultaneously movable in the Y-direction as a whole.

In addition, the lamination unit base 141 may include a lamination unit guide bar 142 for moving the lamination unit 150 up and down.

Figure 3:
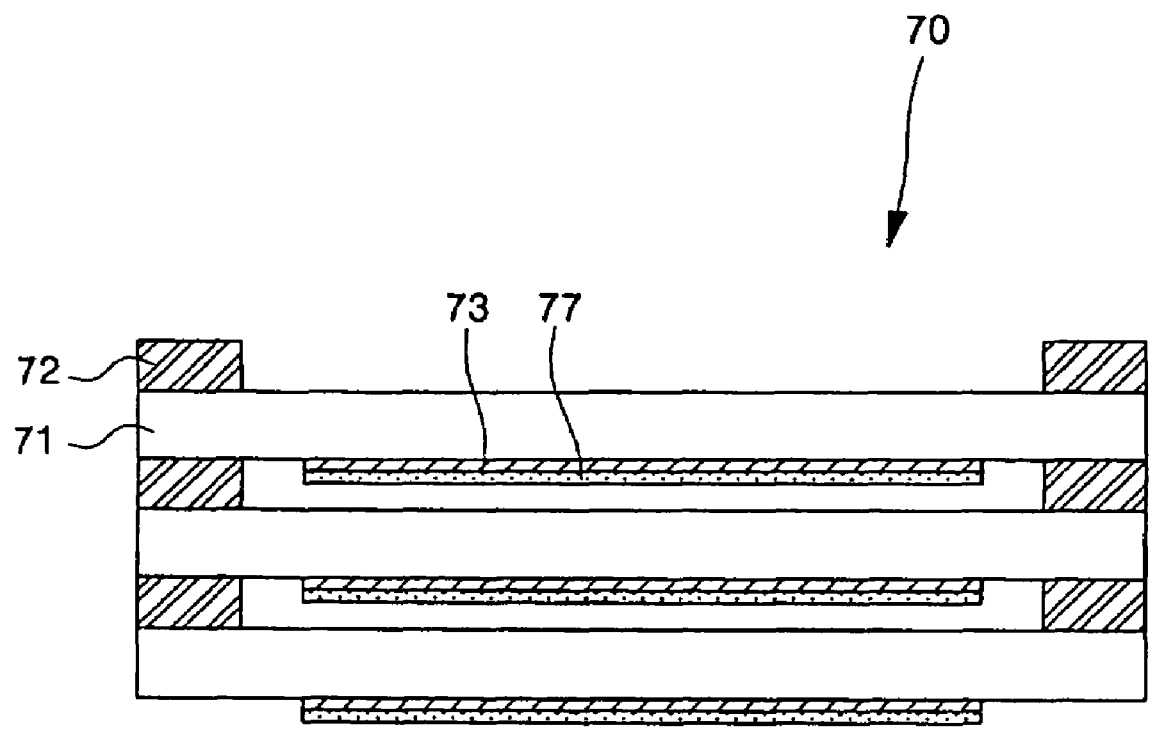
FIG. 3 is a cross-sectional view of a donor film in accordance with an embodiment of the present invention, which is taken along the line III-III' in FIG. 1.

FIG. 3 is a cross-sectional view of a donor film in accordance with an embodiment of the present invention, which is taken along the line III-III' in FIG. 1.

Referring to FIG. 3, a donor film 70 includes a base film 71, and a light-heat conversion layer 73 and a transfer layer 77, which are sequentially deposited on a surface of the base film 71. In addition, the donor film 70 is wound on the film winding means 144 (see FIG. 1) and the film supply means 143 (see FIG. 1) in a multi-layered manner. The base film 71 may be a substrate formed of a transparent polymer organic material such as polyethyleneterephthalate (PET) and so on. The light-heat conversion layer 73, as a layer for converting incident light to heat, may include a light absorbing material such as aluminum oxide, aluminum sulfide, carbon black, graphite, and infrared dye. When a bottom substrate A is an organic light emitting display substrate, the transfer layer 77 may be an organic transfer layer. The organic transfer layer 77 may be one layer selected from a group consisting of a hole injection organic layer, a hole transport organic layer, an emissive organic layer, a hole blocking organic layer, an electron transport organic layer, and an electron injection organic layer.

Protrusions 72 may be located on a surface opposite to a surface, at which the transfer layer 77 of the base film 71 is deposited. As described above, the protrusions 72 may prevent the transfer layer from being damaged, when the donor film is deposited in a multi-layered manner. Further, preferably, the protrusions 72 are located at both edges of the base film 71. In addition, preferably, a height of each of the protrusions 72 is larger than the sum of thicknesses of various layers deposited on the base film 71, i.e., the light-heat conversion layer 73 and the transfer layer 77.

Figure 4:
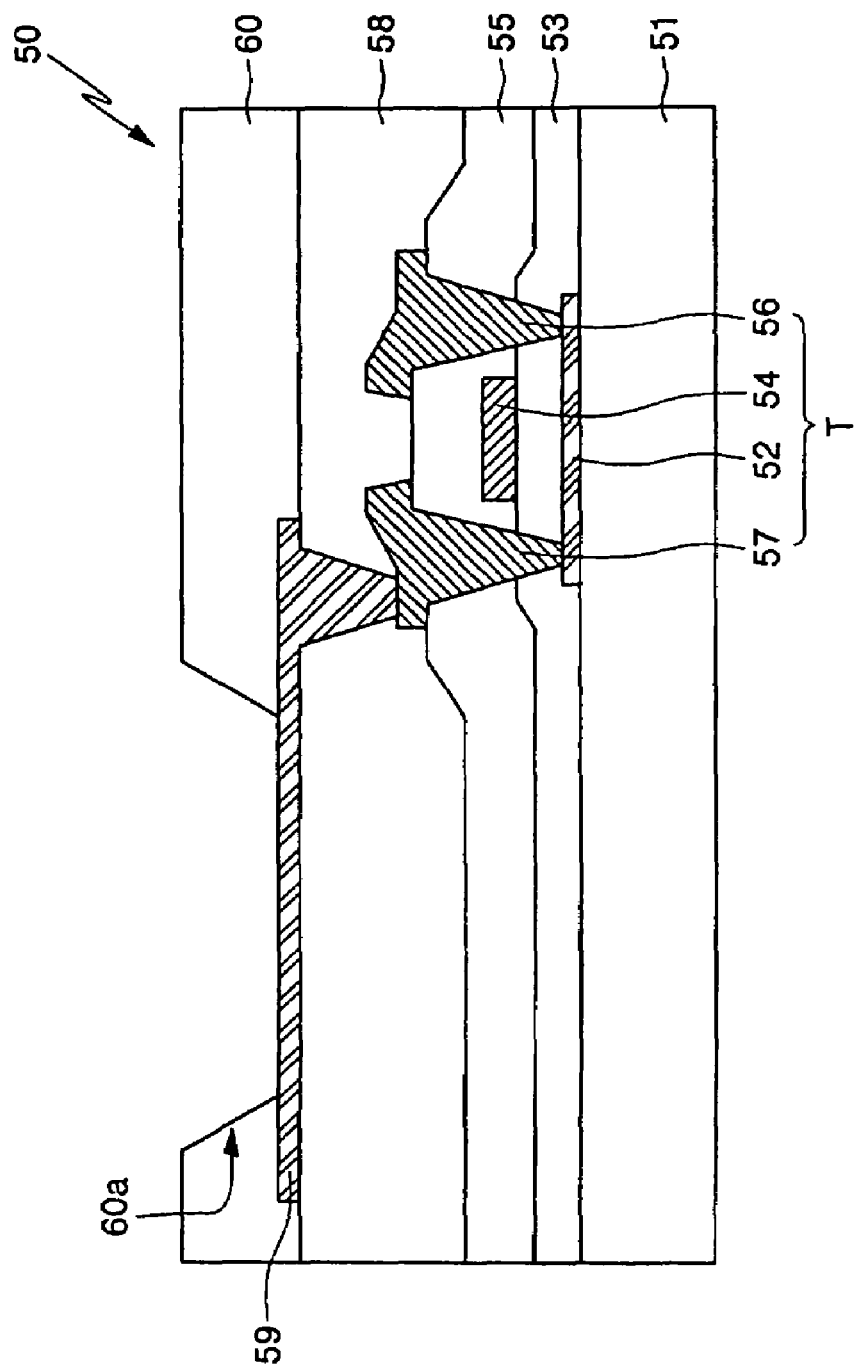
FIG. 4 is a cross-sectional view illustrating a partial region of an organic light emitting display substrate as an embodiment of the acceptor substrate in FIG. 1.

FIG. 4 is an enlarged cross-sectional view illustrating a partial region of an organic light emitting display substrate of an embodiment of the acceptor substrate in FIG. 1.

Referring to FIG. 4, a semiconductor layer 52 is located on a predetermined region of a substrate 51. The semiconductor layer 52 may be an amorphous silicon layer or a polysilicon layer that the amorphous silicon layer is crystallized. A gate insulating layer 53 is located on the semiconductor layer 52. A gate electrode 54 overlapping the semiconductor layer 52 is located on the gate insulating layer 53. A first interlayer insulating layer 55 covering the semiconductor layer 52 and the gate electrode 54 is located on the gate electrode 54. Source and drain electrodes 56 and 57 passing through the first interlayer insulating layer 55 and the gate insulating layer 53 to be in contact with both ends of the semiconductor layer 52 respectively are located on the first interlayer insulating layer 55. The semiconductor layer 52, the gate electrode 54, and the source and drain electrodes 56 and 57 constitute a thin film transistor T. A second interlayer insulating layer 58 covering the source and drain electrodes 56 and 57 is located on the source and drain electrodes 56 and 57. The second interlayer insulating layer 58 may include a passivation layer for protecting the thin film transistor T and/or a planarization layer for attenuating a step due to the thin film transistor. A pixel electrode 59 passing through the second interlayer insulating layer 58 to be in contact with the drain electrode 57 is located on the second interlayer insulating layer 58. The pixel electrode 59 may be, for example, an ITO (indium tin oxide) layer or an IZO (indium zinc oxide) layer. A pixel defining layer 60 having an opening 60a for exposing a portion of the pixel electrode may be located on the pixel electrode 59.

Hereinafter, a laser induced thermal imaging method and method of fabricating an organic light emitting display using the laser induced thermal imaging apparatus described in conjunction with FIGS. 1 and 2 will be described.

Figure 5:
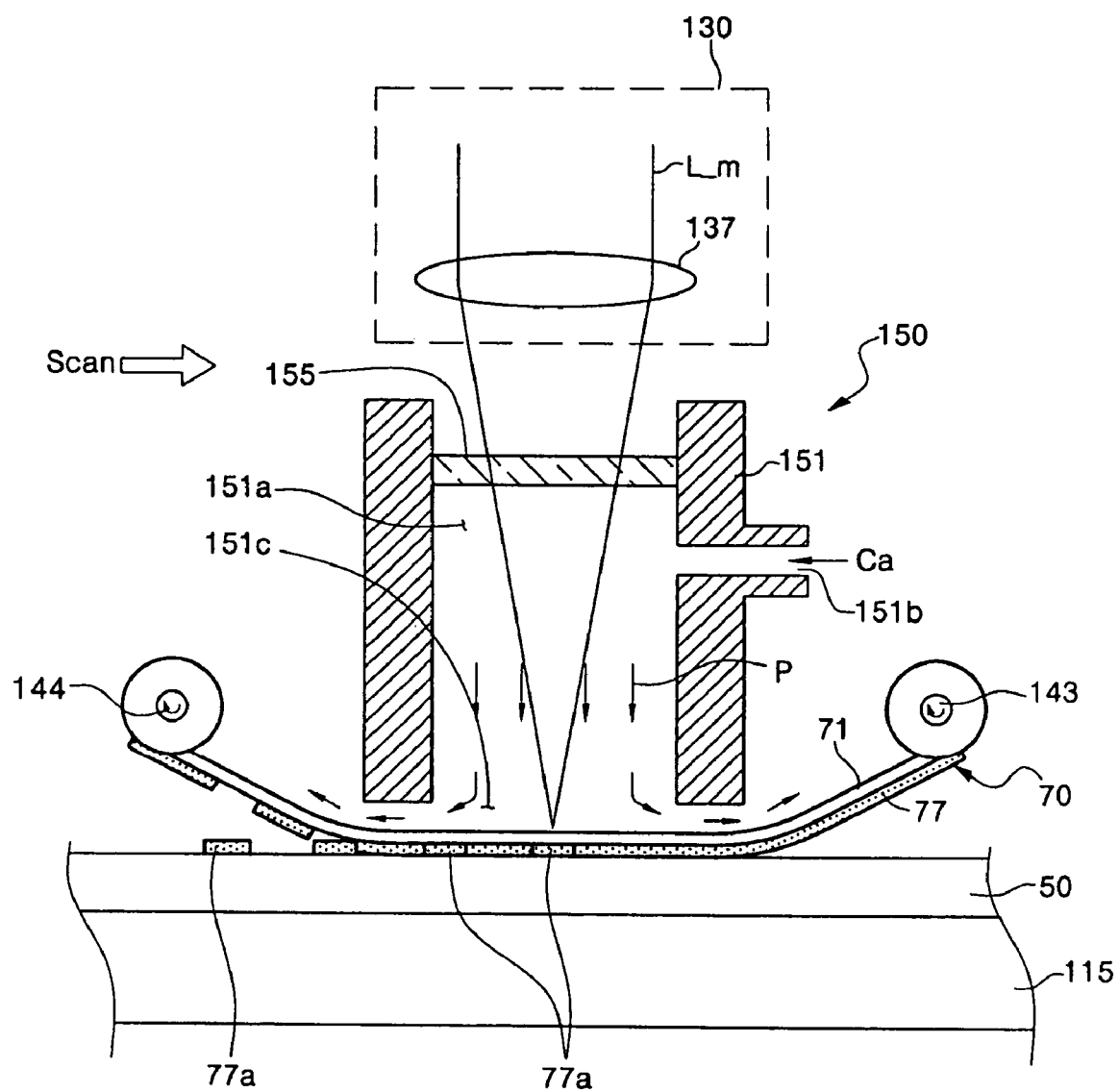
FIG. 5 is a cross-sectional view taken along the line I-I' in FIG. 1.
Figure 6:
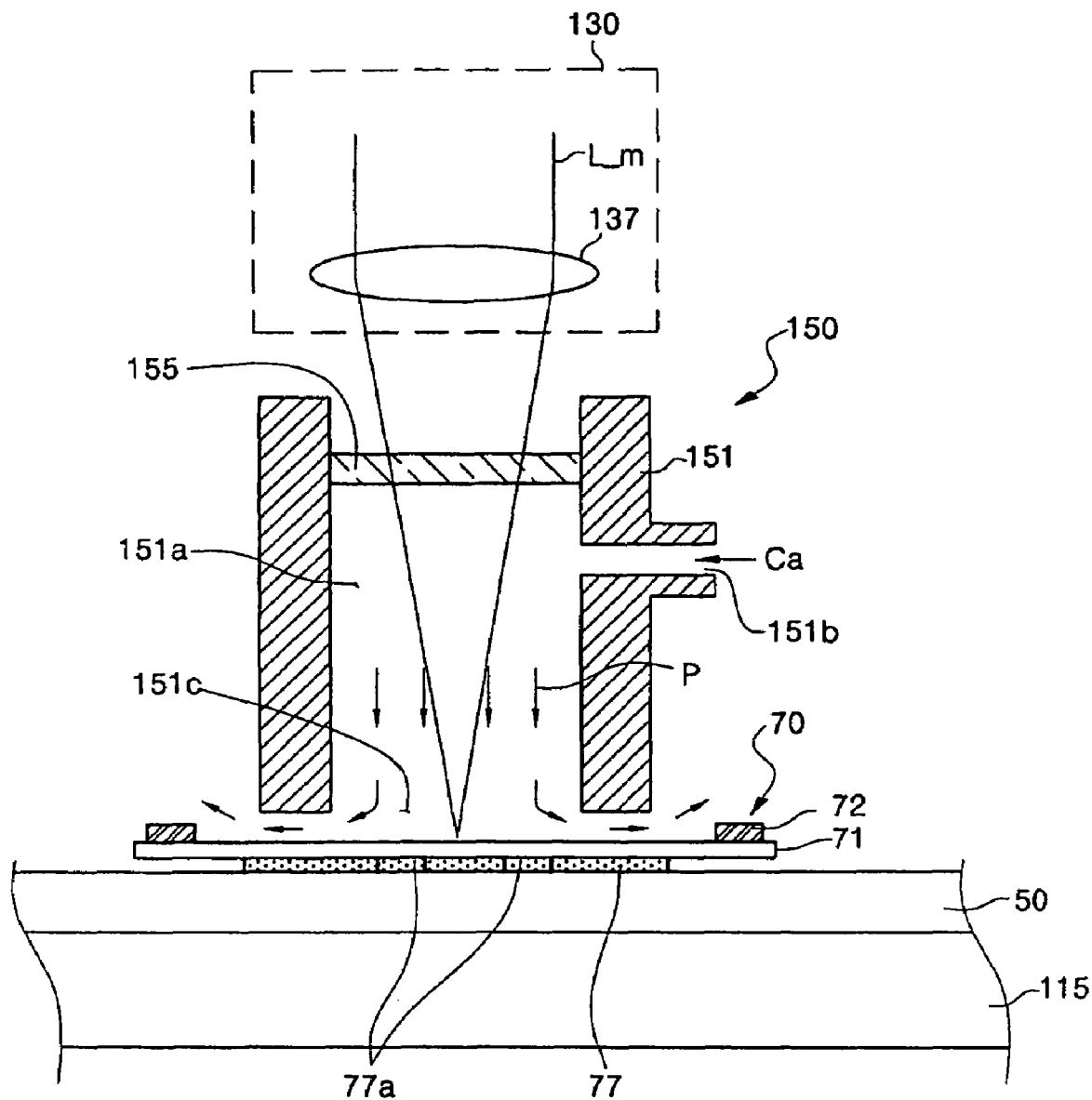
FIG. 6 is a cross-sectional view taken along the line II-II' in FIG. 1.

FIG. 5 is a cross-sectional view taken along the line I-I' in FIG. 1, and FIG. 6 is a cross-sectional view taken along the line II-II' in FIG. 1.

Referring to FIGS. 1, 5 and 6, an acceptor substrate 50 is located on a chuck 115. The acceptor substrate 50 may be the organic light emitting display substrate described in conjunction with FIG. 4.

A donor film 70 is located on the acceptor substrate 50. The donor film 70 includes at least a light-heat conversion layer 73 (see FIG. 3) and a transfer layer 77, and the transfer layer 77 is located opposite to the acceptor substrate 50. The donor film 70 may have a ribbon shape.

Next, a lamination unit 150 moves downward along a lamination unit guide bar 142. As a result, the donor film 70 under the lamination unit 150 may be also moved onto the acceptor substrate 50. The lamination unit 150 may be an apparatus for performing lamination using air pressure. Specifically, the lamination unit 150 may include a body 151 having a cavity 151a, a gas injection port 151b for injecting a compression gas Ca into the cavity 151a, and a gas discharge port 151c for discharging the gas injected into the cavity 151a onto the chuck. Further, the lamination unit 150 may include a light transmission window 155 installed at an upper portion of the body 151, which may be in contact with the cavity 151a. In addition, the gas injection port 151b may be installed to pass through a sidewall of the body 151.

Next, the compression gas Ca is injected into the cavity 151a through the gas injection port 151b of the lamination unit 150. Herein, "compression gas" refers that its gas pressure is higher than atmospheric pressure of the exterior of lamination unit 150. The compression gas injected into the cavity 151a is discharged through the gas discharge port 151c. At this time, a portion of the donor film 70 may be locally laminated on the acceptor substrate 50 by means of the pressure P of the compression gas, and the gas discharged through the gas discharge port 151c may be exhausted to the exterior of the lamination unit 150, thereby forming a predetermined gap between the body 151 and the donor film 70.

Simultaneously, a laser beam is emitted from a light source 131 (see FIG. 2) of a laser irradiator 130 to transmit a projection lens 137. The laser beam transmitted the projection lens 137 passes through the light transmission part of the lamination unit 150, i.e., the light transmission window 155, the cavity 151a and the gas discharge port 151c to be irradiated on the donor film 70. At this time, the pressure applied to the donor film by the lamination unit 150, i.e., the pressure P of the compression gas may be parallel to a direction that the laser beam is irradiated. Therefore, the laser beam is irradiated on a portion, at which the donor film 70 is sufficiently laminated on the acceptor substrate 50, to enable to reduce transfer inferiority. As a result, it is possible to obtain an excellent transfer pattern profile.

The light-heat conversion layer 73 (see FIG. 3) absorbs the laser beam to generate heat at a region of the donor film 70, at which the laser beam is irradiated, and the transfer layer 77 under the light-heat conversion layer 73 is transferred on the acceptor substrate 50 due to variance of contact force with the light-heat conversion layer 73 caused by the heat. Finally, a patterned transfer layer 77a is formed on the acceptor substrate 50.

A laser irradiator base 125 continuously moves in a Y-axis direction along a laser guide bar 123. Therefore, the laser irradiator 130 installed at the laser irradiator base 125, a lamination unit base 141 connected to the laser irradiator base 125, the lamination unit 150 installed at the lamination unit base 141, donor film supply means 143 and donor film winding means 144 may be also continuously moved in the Y-axis direction. As a result, the lamination and the laser irradiation may be continuously performed in the Y-direction.

At this time, the donor film winding means 144 winds the donor film at a speed synchronized with a speed that the laser irradiator base 125, i.e., the laser irradiator 130 moves. As a result, a portion having a non-patterned transfer layer 77 of the donor film 70 may be continuously located under the lamination unit 150. At this time, the lamination unit 150 may be moved on the donor film 70 without friction by a direct contact with the donor film 70 due to a gap between the body 151 and the donor film 70. As a result, when the transfer layer of the donor film 70 is an organic layer, it is possible to minimize damage of the organic layer.

When the laser irradiator 130 arrives at an edge of the acceptor substrate 50, the compression gas is not supplied to the lamination unit 150, and the lamination unit 150 moves upward along the lamination unit guide bar 142. As a result, the donor film 70 under the lamination unit 150 is detached from the acceptor substrate.

Subsequently, the chuck 115 moves one step along the chuck guide bar 113, and the lamination and the laser irradiation are repeated.

Figure 7:
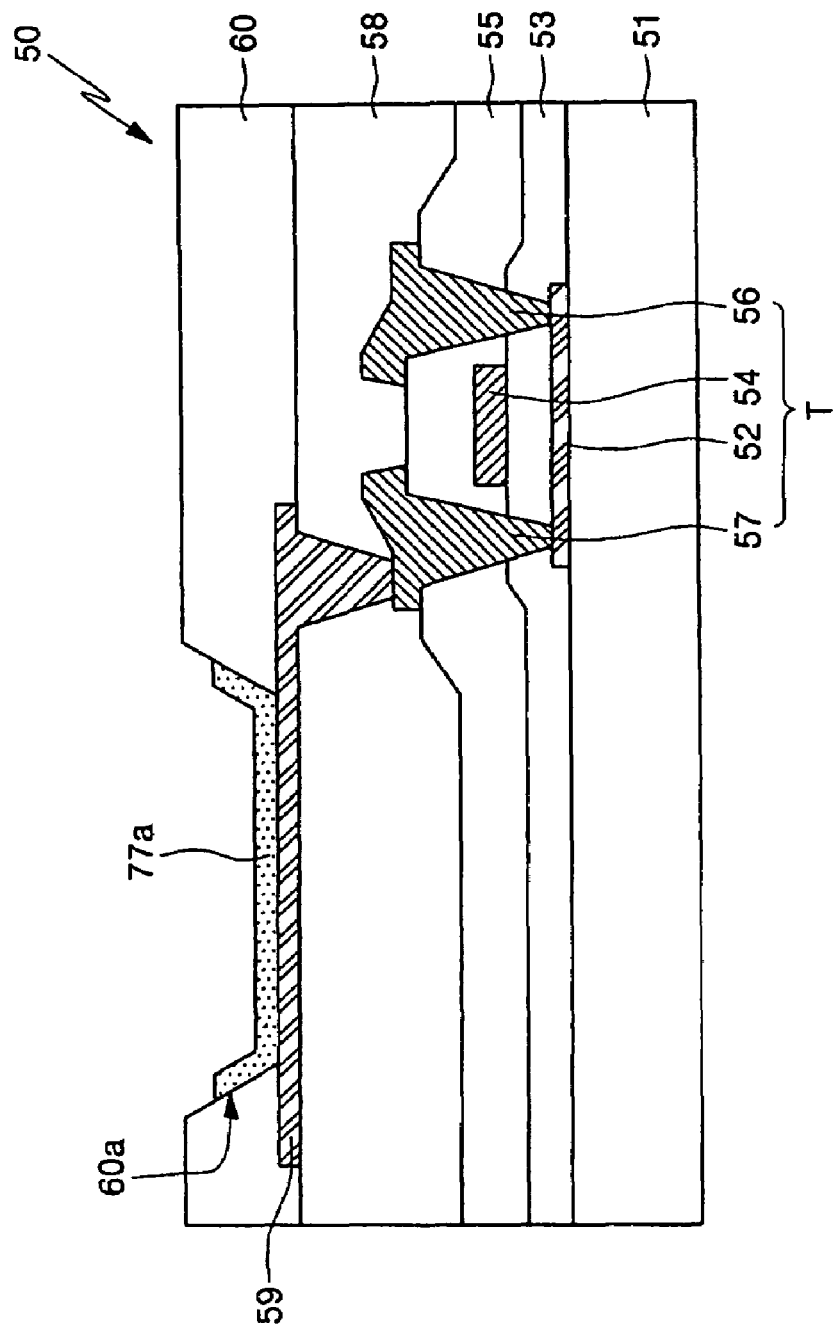
FIG. 7 is a cross-sectional view illustrating a partial region of an organic light emitting display substrate including a patterned transfer layer.

FIG. 7 is an enlarged cross-sectional view illustrating a partial region of an organic light emitting display (OLED) substrate including a patterned transfer layer.

Referring to FIG. 7, a transfer layer pattern 77a is located on a pixel electrode 59 exposed in an opening 60a of the OLED substrate described in conjunction with FIG. 4. The transfer layer pattern 77a may be an emission layer. Further, the transfer layer pattern 77a may further include at least one layer selected from a group consisting of a hole injection layer, a hole transport layer, a hole blocking layer, an electron transport layer, and an electron injection layer.

Figure 8:
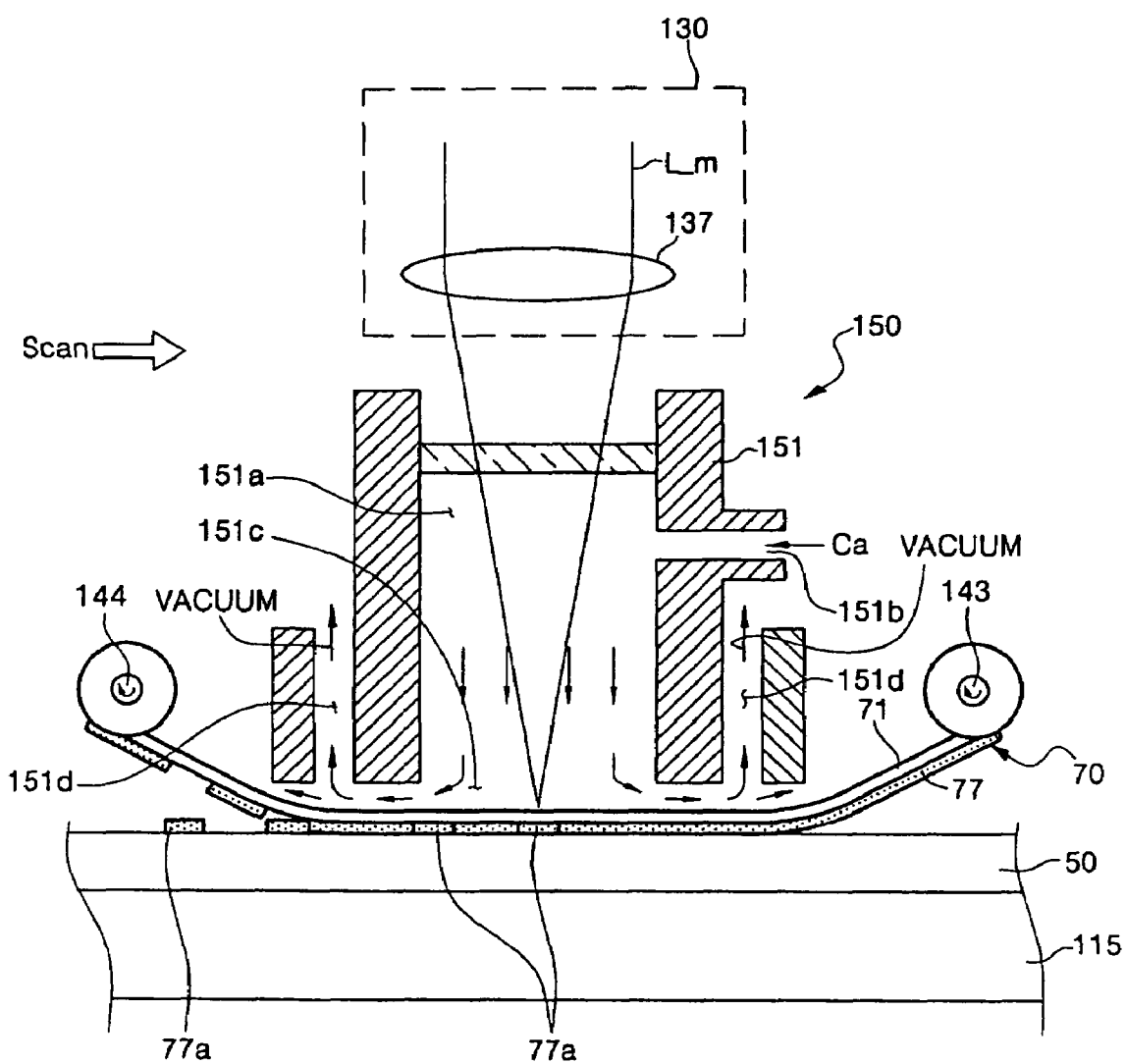
FIG. 8 is a cross-sectional view of a laser induced thermal imaging apparatus in accordance with another embodiment of the present invention.

FIG. 8 is a cross-sectional view of a laser induced thermal imaging apparatus in accordance with another embodiment of the present invention. The laser induced thermal imaging apparatus in accordance with the embodiment is similar to the laser induced thermal imaging apparatus described in conjunction with FIGS. 1 to 7, except for the following descriptions.

Referring to FIG. 8, a lamination unit 150 may further include an exhaust port 151d for exhausting a gas discharged on a chuck 115 of an outer periphery of a body 151. The exhaust port 151d is connected to an exhaust pump.

In this case, a compression gas Ca injected into a cavity 151a from a gas injection port 151b is discharged through a gas discharge port 151c. At this time, a donor film 70 may be laminated on an acceptor substrate 50 by means of the pressure of the compression gas Ca, and the gas discharged through the gas discharge port 151c is exhausted through the exhaust port 151d, thereby forming a predetermined gap between the body 151 and the donor film 70. The gas discharged through the gas discharge port 151c may escape through the exhaust port 151d as well as the exterior of the lamination unit 150.

Figure 9:
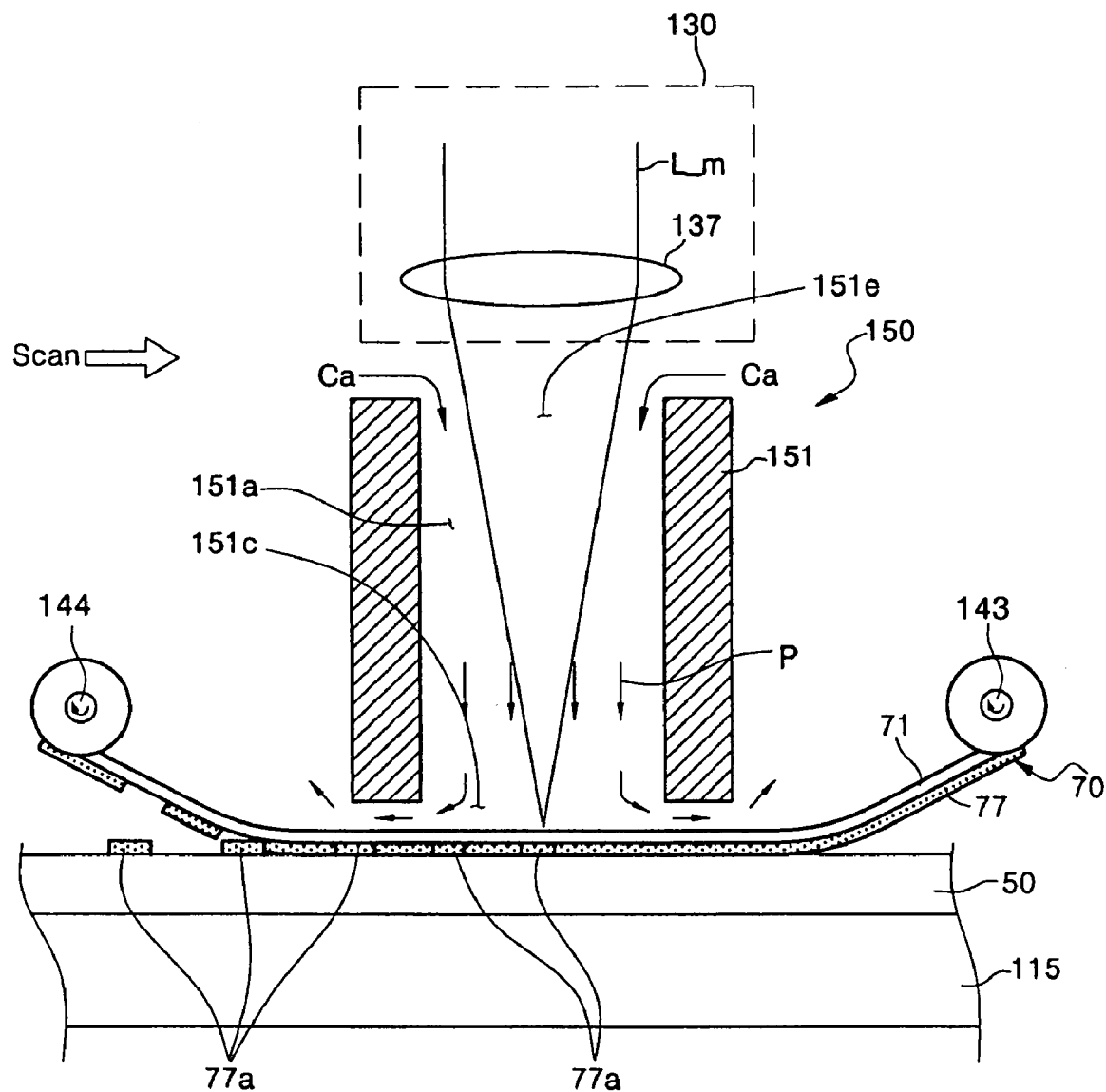
FIG. 9 is a cross-sectional view of a laser induced thermal imaging apparatus in accordance with still another embodiment of the present invention.

FIG. 9 is a cross-sectional view of a laser induced thermal imaging apparatus in accordance with another embodiment of the present invention. The laser induced thermal imaging apparatus in accordance with the embodiment is similar to the laser induced thermal imaging apparatus described in conjunction with FIGS. 1 to 7, except for the following descriptions.

Referring to FIG. 9, a gas injection port 151e of a lamination unit passes through an upper portion of a body 151 of the lamination unit. In addition, a gas discharge port 151c passes through a lower portion of the body 151. In this case, the laser irradiated from a laser irradiator 130 may be irradiated on the donor film 70 by passing through the gas injection port 151e, the cavity 151a, and the gas discharge port 151c. Therefore, the gas injection port 151e, the cavity 151a, and the gas discharge port 151c may constitute a light transmission part. The laser induced thermal imaging apparatus may not require the light transmission window 155 (see FIG. 1), unlike the laser induced thermal imaging apparatus described in conjunction with FIG. 1.

The compression gas Ca injected into the cavity 151a from the gas injection port 151e is discharged through the gas discharge port 151c. At this time, the donor film may be laminated on the substrate by means of the pressure of the compression gas Ca, and the gas discharged through the gas discharge port 151c is exhausted to the exterior of the lamination unit 150, thereby forming a predetermined gap between the body 151 and the donor film 70.

Figure 10:
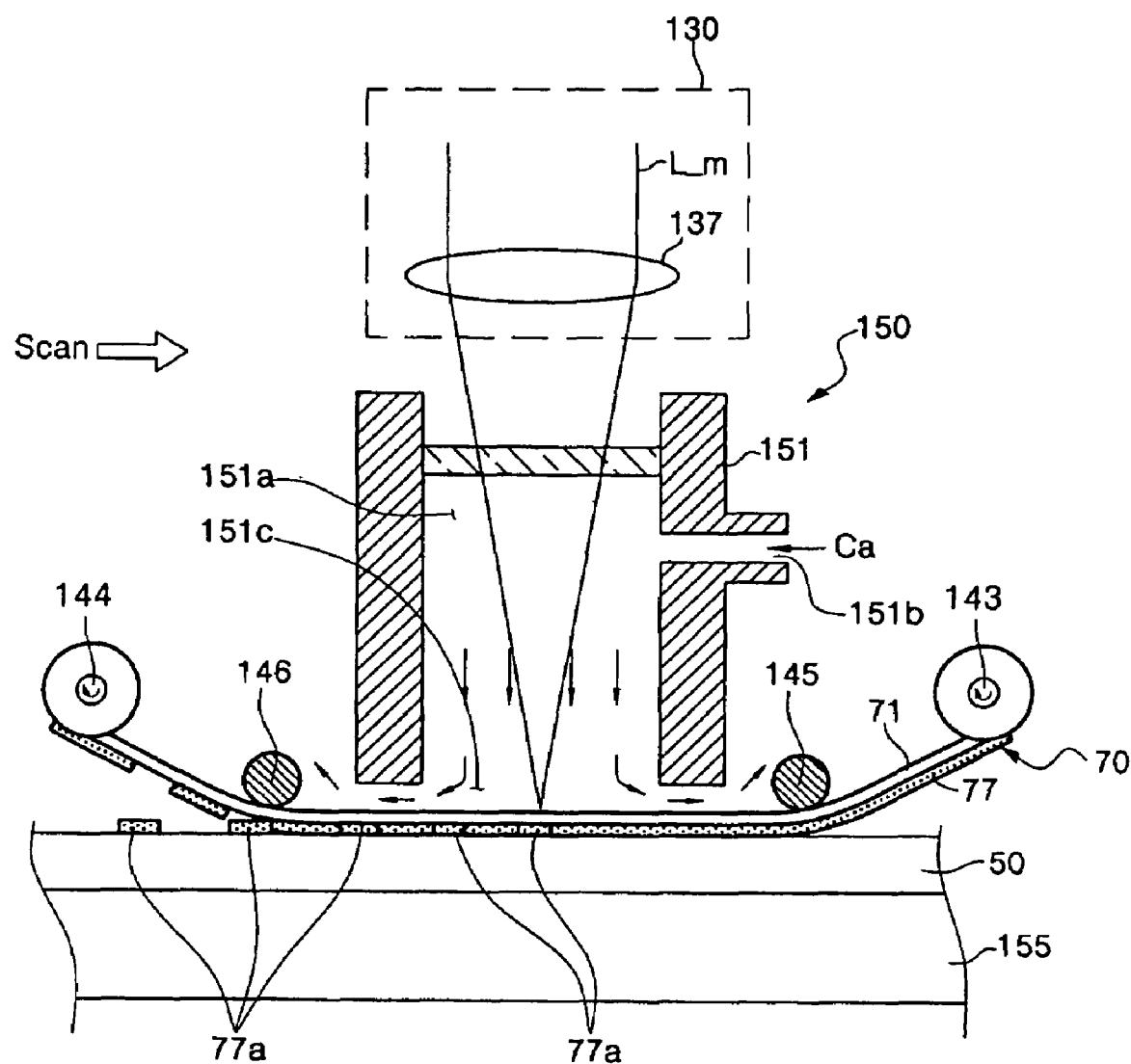
FIG. 10 is a cross-sectional view of a laser induced thermal imaging apparatus in accordance with yet another embodiment of the present invention.

FIG. 10 is a cross-sectional view of a laser induced thermal imaging apparatus in accordance with another embodiment of the present invention. The laser induced thermal imaging apparatus in accordance with the embodiment is similar to the laser induced thermal imaging apparatus described in conjunction with FIGS. 1 to 7, except for the following descriptions.

Referring to FIG. 10, the apparatus further includes guide rolls 145 and 146 for closely adhering the donor film 70 on the acceptor substrate 50 to at least one side of the lamination unit 150. The guide rolls 145 and 146 function to press the donor film 70 to closely adhere the donor film 70 on the acceptor substrate 50. As a result, the donor film 70 may be readily laminated on the acceptor substrate 50.

Figure 11:
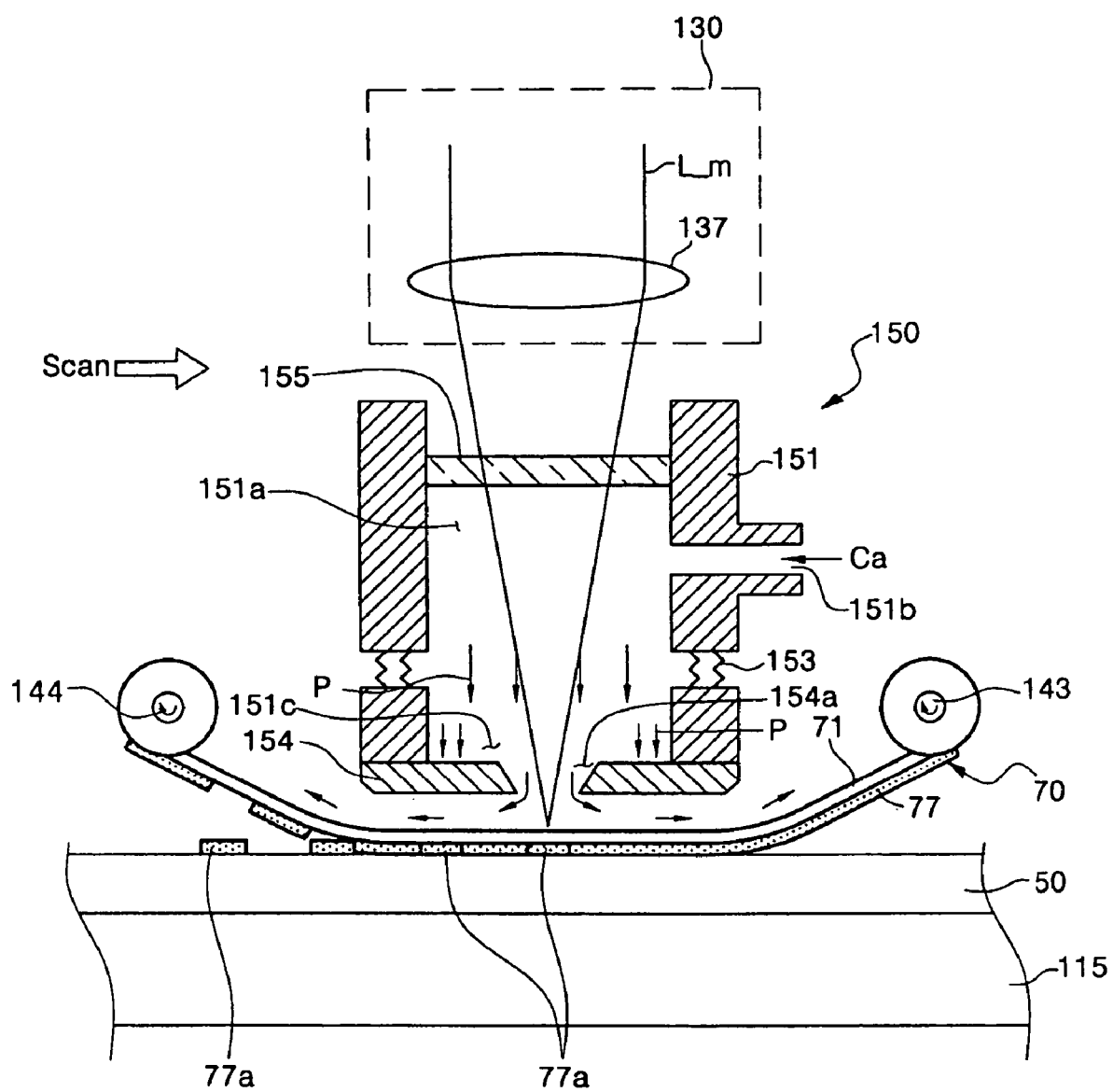
FIG. 11 is a cross-sectional view of a laser induced thermal imaging apparatus in accordance with yet another embodiment of the present invention.

FIG. 11 is a cross-sectional view of a laser induced thermal imaging apparatus in accordance with another embodiment of the present invention.

The laser induced thermal imaging apparatus in accordance with the embodiment is similar to the laser induced thermal imaging apparatus described in conjunction with FIGS. 1 to 7, except for the following descriptions.

Referring to FIG. 11, a sidewall of the lamination unit body 151 includes an upper sidewall and a lower sidewall, which are connected to each other by means of an elastic body 153. As a result, even when the lamination unit 150 is too closely located on the donor film 70, it is possible to maintain a uniform gap between the body 151 and the donor film 70 due to the elastic body 153. Specifically, in order to sufficiently laminate the donor film 70 on the substrate 50, preferably, the lamination unit 150 is closely located on the donor film 70. However, since the substrate 50 may have unevenness due to a structure on its surface, and the lamination unit body 151 may be partially in contact with the donor film 70, in this case, friction between the lamination unit body 151 and the donor film 70 may be generated. The donor film 70 may be damaged due to generation of the friction. However, since the elastic body 153 may shrink or release the sidewall of the lamination unit body 151 depending on the pressure of the gas exhausted to the exterior of the lamination unit 150 through the gas discharge port 151c, even though the surface of the substrate 50 has the unevenness, it is possible to form a uniform gap between the body 151 and the donor film 70.

For this, more preferably, a nozzle part 154 including a nozzle 154a may be attached to the gas discharge port 151c of the lamination unit body 151. The nozzle 154a has a size smaller than that of the gas discharge port 151c to more effectively laminate the donor film 70, the nozzle part 154 is subjected to force in a direction of the donor film 70 due to the pressure P of the compression air Ca injected into the cavity 151a from the gas injection port 151b, and the nozzle part 154 is subjected to force due to the pressure of the gas discharged to the exterior of the lamination unit 150 through the nozzle 154a, thereby forming a predetermined gap between the nozzle part 154 and the donor film 70. Further, although the surface of the substrate 50 has the unevenness due to the elastic body 153, it is possible to form a uniform gap between the body 151 and the donor film 70. As a result, it is possible to minimize friction between the lamination unit 150 and the donor film 70.

Differently from this, the same effect may be obtained even when the nozzle part 154 is made of an elastic material without individual elastic body 153.

Preferably, the lamination unit 150 includes a light transmission window 155 installed at an upper portion of the body 151, which is in contact with the cavity 151a. In this case, the laser passes through the light transmission window 155, the cavity 151a, and the nozzle 154a to be irradiated on the donor film 70. In addition, the gas injection port 151b may pass through an upper sidewall of the body 151.

Figure 12:
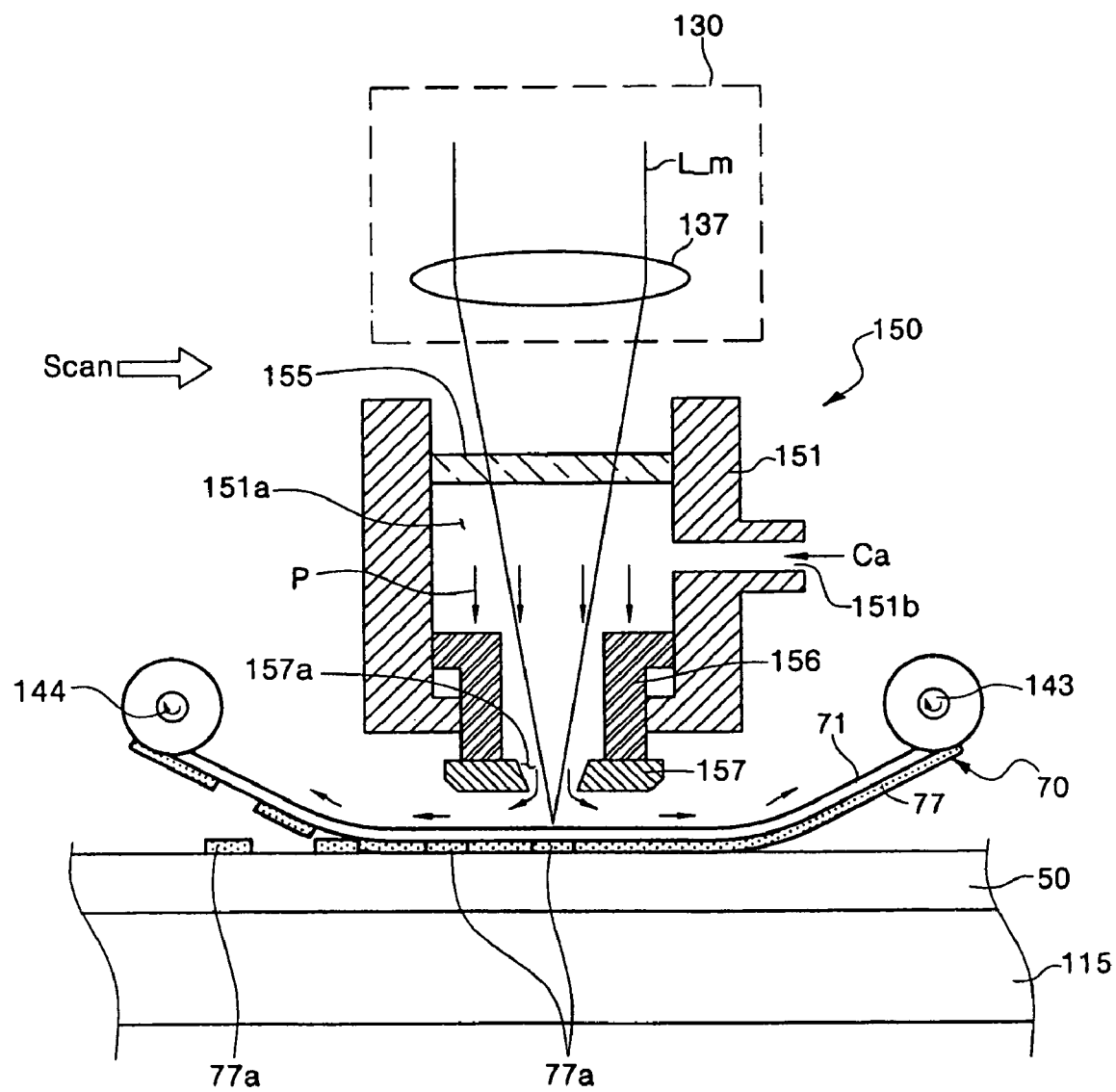
FIG. 12 is a cross-sectional view of a laser induced thermal imaging apparatus in accordance with yet another embodiment of the present invention.

FIG. 12 is a cross-sectional view of a laser induced thermal imaging apparatus in accordance with another embodiment of the present invention. The laser induced thermal imaging apparatus in accordance with the embodiment is similar to the laser induced thermal imaging apparatus described in conjunction with FIGS. 1 to 7, except for the following descriptions.

Referring to FIG. 12, the lamination unit 150 further includes a pipe-shaped piston 156 attached to a lower end of the lamination unit body 151, i.e., the gas discharge port of the lamination unit body 151. The piston 156 is movable up and down along the lamination unit body 151. At this time, a head part of the piston 156 is subjected to force in a direction of the donor film 70, i.e., a downward direction, due to the pressure P of the compression air Ca injected into the cavity 151a from the gas injection port 151b, and the piston 156 is subjected to force in an upward direction due to the pressure of the gas discharged to the exterior of the lamination unit 150 through an inner part of the piston, thereby forming a predetermined gap between the piston 156 and the donor film 70. In addition, since the piston 156 is movable up or down along the lamination unit body 151, even when the lamination unit 150 is too closely located on the donor film 70, it is possible to maintain a uniform gap between the body 151 and the donor film 70 due to the pressure of the gas exhausted to the exterior of the lamination unit 150 through the inner part of the piston. As a result, it is possible to minimize friction between the lamination unit 150 and the donor film 70.

Further, a nozzle part 157 including a nozzle 157a may be additionally attached to a lower portion of the pipe-shaped piston 156. The nozzle part 157 has functions similar to the nozzle part 154 of the laser induced thermal imaging apparatus as described in conjunction with FIG. 11.

Figure 13:
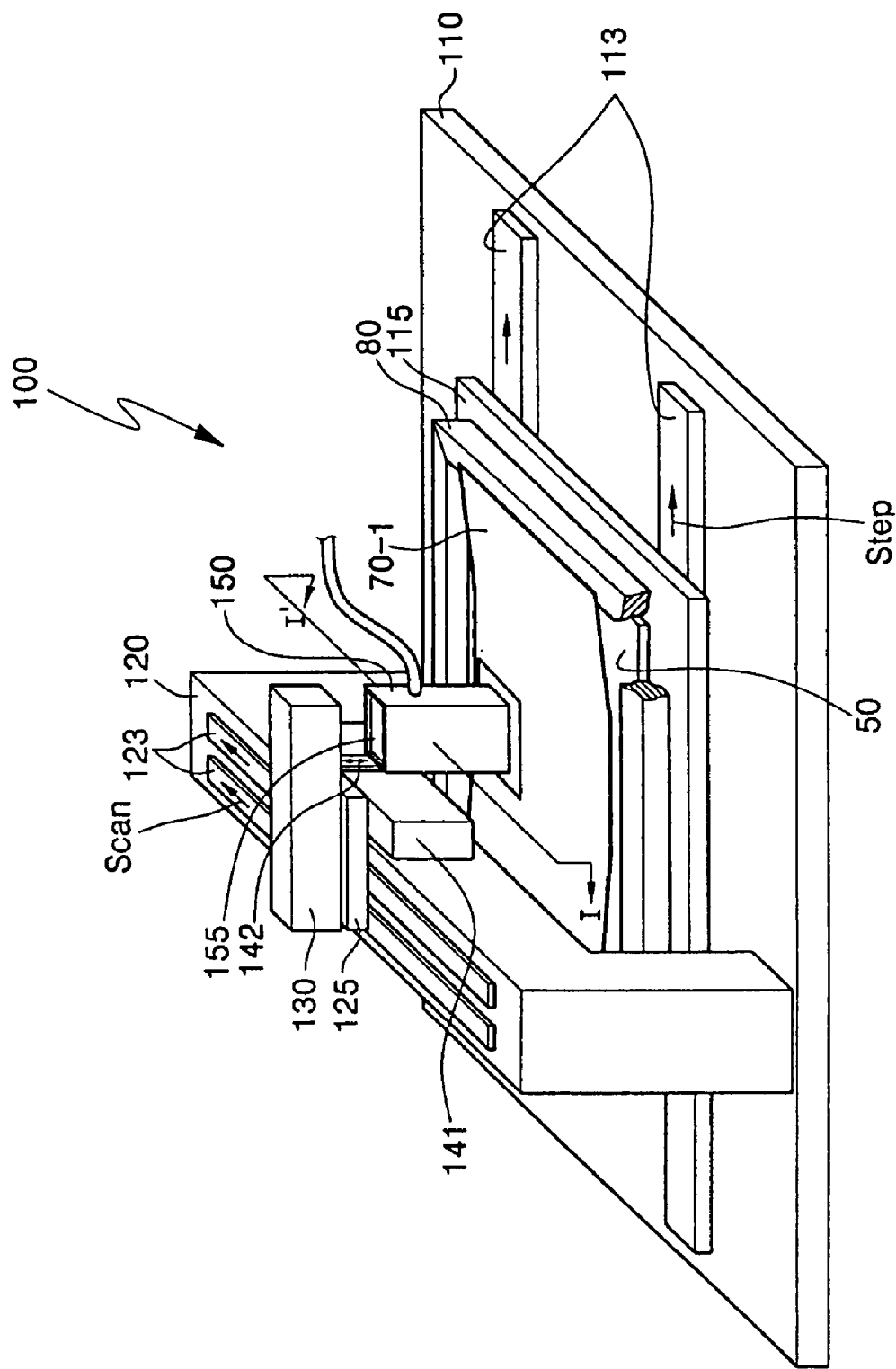
FIG. 13 is a schematic perspective view of a laser induced thermal imaging apparatus in accordance with another embodiment of the present invention.
Figure 14:
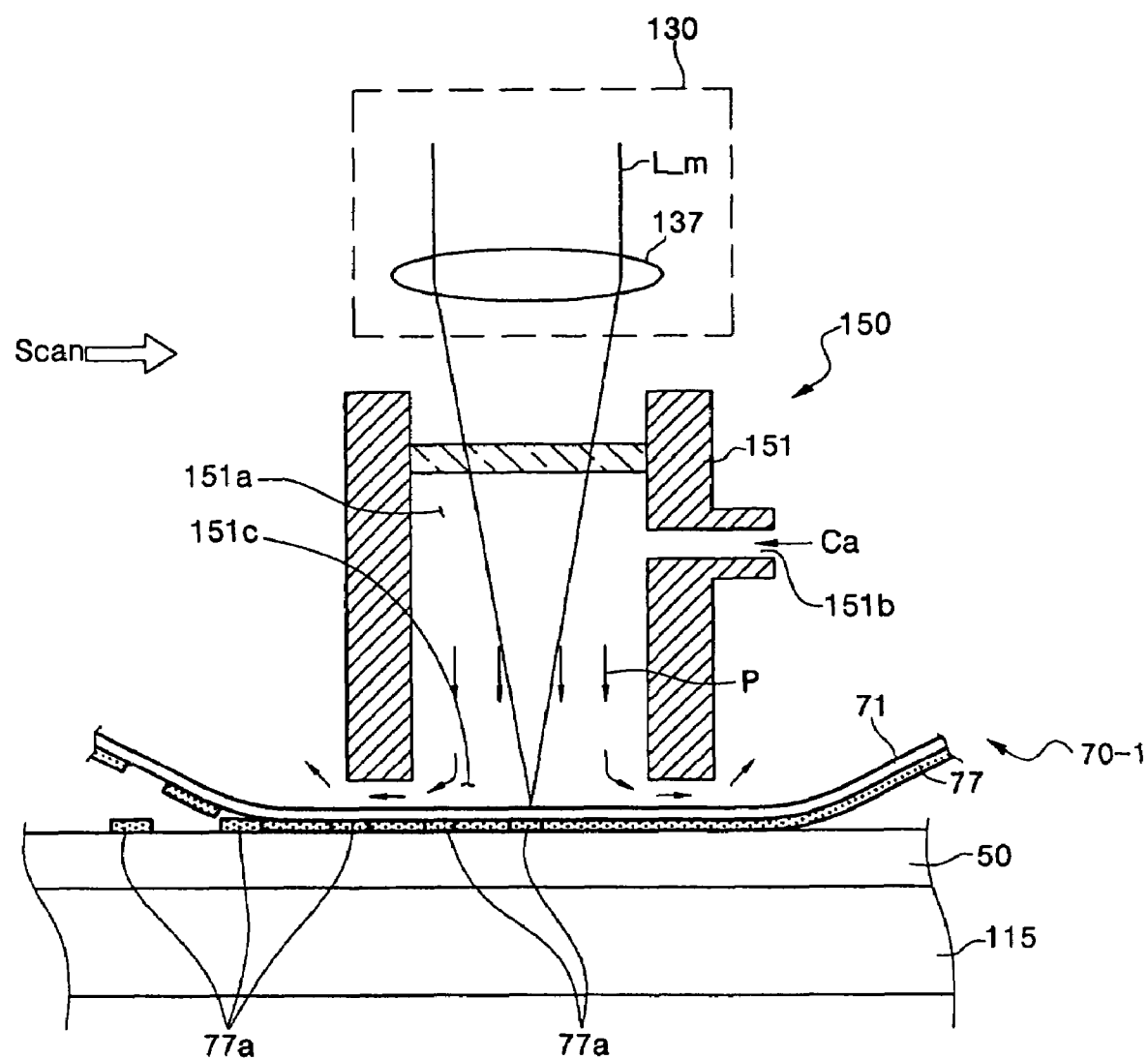
FIG. 14 is a cross-sectional view taken along the line I-I' in FIG. 13.

FIG. 13 is a partially exploded perspective view schematically illustrating a laser induced thermal imaging apparatus in accordance with another embodiment of the present invention, and FIG. 14 is a cross-sectional view taken along the line I-I' in FIG. 13. Differently from the laser induced thermal imaging apparatus described in conjunction with FIGS. 1 to 7, the laser induced thermal imaging apparatus in accordance with the embodiment employs a donor film covering an entire surface of the acceptor substrate.

Referring to FIGS. 13 and 14, a chuck 115 fixes an acceptor substrate 50 to be located on the chuck 115. A donor film 70-1 is disposed on the acceptor substrate 50. At least two corners of the donor film 70-1 are preferably fixed to a frame 80. As a result, the donor film 70-1 may maintain an appropriate tension, and it is possible to maintain a uniform gap between the donor film 70-1 and the acceptor substrate 50 at edges of the donor film 70-1. In this case, preferably, the chuck 115 also fixes the frame 80.

Differently from the drawings, the lamination unit 150 of the embodiment may include at least one of particular components of the lamination unit described in conjunction with FIGS. 8 to 12.

Hereinafter, a laser induced thermal imaging method using the laser induced thermal imaging apparatus in accordance with an embodiment of the present invention will be described in conjunction with FIGS. 13 and 14.

Referring to FIGS. 13 and 14, an acceptor substrate 50 is located on a chuck 115. The acceptor substrate 50 may be an OLED substrate described in conjunction with FIG. 4. A donor film 70-1, at least two corners of which are fixed to a frame 80, is located on the acceptor substrate 50. Locating the donor film 70-1 on the acceptor substrate 50 may be performed as the chuck 115 fixes the frame 80. The donor film 70-1 includes at least a light-heat conversion layer 73 (see FIG. 3) and a transfer layer 77, and the transfer layer 77 is located opposite to the acceptor substrate 50.

Next, a lamination unit 150 moves downward along a lamination unit guide bar 142. As a result, the donor film 70-1 under the lamination unit 150 is also movable onto the acceptor substrate 50.

Continuously, a compression gas Ca is injected into a cavity 151a through a gas injection port 151b of the lamination unit 150. The compression gas injected into the cavity 151a is discharged through a gas discharge port 151c. At this time, the donor film 70-1 may be laminated on the acceptor substrate 50 by the pressure P of the compression gas, and the gas discharged through the gas discharge port 151c is exhausted to the exterior of the lamination unit 150, thereby forming a predetermined gap between the body 151 and the donor film 70-1.

In this case, although bubbles are generated between the acceptor substrate 50 and the donor film 70-1 due to the donor film 70-1 having an appropriate tension by virtue of the frame 80, the bubbles may escape from the donor film 70-1 and the acceptor substrate 50 located adjacent to a portion where the lamination is not performed. As a result, it is possible to prevent transfer failures due to the bubbles.

Next, a laser beam is emitted from a light source 131 (see FIG. 2) of a laser irradiator 130 to pass through a projection lens 137. The laser beam passed through the projection lens 137 is irradiated on the donor film 70-1 through a light transmission part of the lamination unit 150, i.e., a light transmission window 155, the cavity 151a, and the gas discharge port 151c. At this time, at least a portion of the transfer layer 77 is transferred on the acceptor substrate 50 at a region of the donor film 70-1 where the laser beam is irradiated. As a result, a patterned transfer layer 77a is formed on the acceptor substrate 50.

At this time, a laser irradiator base 125 moves continuously in a Y-direction along a laser guide bar 123. Therefore, the laser irradiator 130 installed at the laser irradiator base 125, a lamination unit base 141 connected to the laser irradiator base 125, and the lamination unit 150 installed at the lamination unit base 141 also continuously move in the Y-axis direction. On the other hand, the donor film 70-1 is fixedly located on the chuck 115 by the frame 80. As a result, the lamination and the laser irradiation may be continuously performed in the Y-direction. At this time, the lamination unit 150 may move on the donor film 70-1 without friction caused by a direct contact with the donor film 70-1, since a gap is generated between the body 151 and the donor film 70-1.

In addition, the laser irradiator 130 continuously irradiates a laser beam. Therefore, the transfer layer pattern 77a is continuously generated on the acceptor substrate 50 along the Y-axis direction.

When the laser irradiator 130 arrives at an edge of the acceptor substrate 50, the compression gas is not supplied to the lamination unit 150, and the lamination unit 150 moves upward along the lamination unit guide bar 142. As a result, the donor film 70 under the lamination unit 150 is detached from the acceptor substrate.

Next, the chuck 115 moves one step along the chuck guide bar 113, and the laser irradiation process is repeated.

Figure 15:
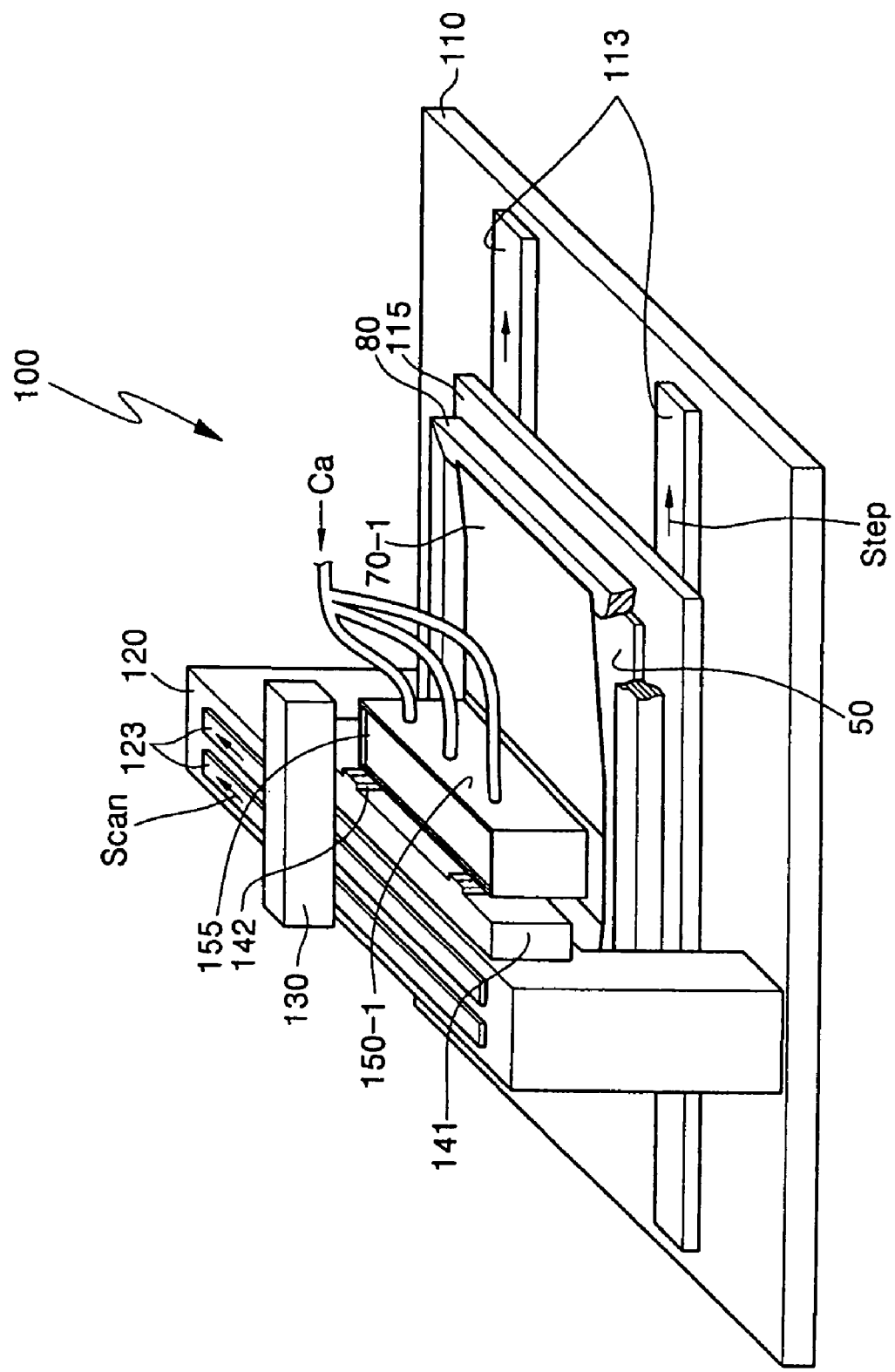
FIG. 15 is a partially exploded perspective view schematically illustrating a laser induced thermal imaging apparatus in accordance with another embodiment of the present invention.

FIG. 15 is a partially enlarged perspective view schematically illustrating a laser induced thermal imaging apparatus in accordance with another embodiment of the present invention. The laser induced thermal imaging apparatus in accordance with the embodiment is similar to the laser induced thermal imaging apparatus described in conjunction with FIG. 13, except for the following descriptions.

Referring to FIG. 15, a lamination unit 150-1 has a line shape extending in a Y-direction crossing a chuck 115. Therefore, a donor film 70-1 may be laminated on an acceptor substrate 50 in a Y-direction crossing the chuck 115 in an extended manner. Further, a body of the lamination unit 150-1 may include a plurality of compression gas injection ports to uniformly supply the compression gas into the cavity of the lamination unit. In this case, a laser irradiator 130 may continuously irradiate a laser beam while moving along the lamination unit 150-1 in the Y-direction. As a result, the laser beam may be irradiated along the laminated donor film in the Y-direction.

Differently from the drawings, the lamination unit 150-1 of the embodiment may include at least one of particular components of the lamination unit described in conjunction with FIGS. 8 to 12.

As can be seen from the foregoing, the donor film may be sufficiently laminated on the acceptor substrate without generating friction between the transfer layer of the donor film and the acceptor substrate, and it is possible to obtain an excellent transfer pattern profile by irradiating the laser beam on the sufficiently laminated donor film.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A laser induced thermal imaging apparatus comprising:
a chuck for fixing an acceptor substrate;
a lamination unit, for laminating a donor film on the acceptor substrate, located on the chuck, and including a body having a cavity, a gas injection port for injecting a compression gas into the cavity and a gas discharge port for discharging the gas injected into the cavity onto the substrate; and
a laser irradiator located on the lamination unit and irradiating a laser beam on the laminated donor film through the lamination unit.

2. The laser induced thermal imaging apparatus according to claim 1, wherein the laser irradiator irradiates the laser beam on the donor film through the cavity and the gas discharge port of the lamination unit.

3. The laser induced thermal imaging apparatus according to claim 1, wherein the lamination unit is installed on an upper portion of the body, and further includes a light transmission window in contact with the cavity.

4. The laser induced thermal imaging apparatus according to claim 3, wherein the gas injection port passes through a sidewall of the body.

5. The laser induced thermal imaging apparatus according to claim 1, wherein the gas injection port passes through an upper portion of the lamination unit body, and the gas discharge port passes through a lower portion of the lamination unit body.

6. The laser induced thermal imaging apparatus according to claim 1, wherein the lamination unit further includes an exhaust port for exhausting the gas discharged onto the chuck of an outer periphery of the body.

7. The laser induced thermal imaging apparatus according to claim 6, wherein the exhaust port is connected to an exhaust pump.

8. The laser induced thermal imaging apparatus according to claim 1, wherein the lamination unit body has a sidewall having upper and lower sidewalls, which are connected to each other by an elastic body.

9. The laser induced thermal imaging apparatus according to claim 8, wherein the lamination unit is attached to the gas discharge port of the body, and further includes a nozzle part having a nozzle.

10. The laser induced thermal imaging apparatus according to claim 8, wherein the lamination unit is installed on an upper portion of the body, and further includes a light transmission window in contact with the cavity.

11. The laser induced thermal imaging apparatus according to claim 10, wherein the gas injection port passes through the upper sidewall of the body.

12. The laser induced thermal imaging apparatus according to claim 1, wherein the lamination unit is attached to the gas discharge port, and further includes a piston having a pipe shape.

13. The laser induced thermal imaging apparatus according to claim 12, further comprising a nozzle part attached to a lower portion of the pipe-shaped piston and having a nozzle.

14. The laser induced thermal imaging apparatus according to claim 1, wherein the lamination unit is movable up and down.

15. The laser induced thermal imaging apparatus according to claim 1, further comprising a guide roll for contacting the donor film on the acceptor substrate to at least one side of the lamination unit.

16. The laser induced thermal imaging apparatus according to claim 1, wherein the laser irradiator and the lamination unit are simultaneously movable in a Y-direction crossing the chuck.

17. The laser induced thermal imaging apparatus according to claim 16, further comprising an optical stage crossing the chuck in the Y-direction,
wherein the laser irradiator is installed on a top surface of the optical stage through a laser irradiator base, a lamination unit base is connected to the laser irradiator base, and the lamination unit is installed on the lamination unit base.

18. The laser induced thermal imaging apparatus according to claim 1, wherein the lamination unit has a line shape extending in a Y-direction crossing the chuck.

19. The laser induced thermal imaging apparatus according to claim 18, wherein the laser irradiator irradiates a laser while moving in the Y-direction along the lamination unit.

20. The laser induced thermal imaging apparatus according to claim 19, wherein the body of the lamination unit includes a plurality of compression gas injection ports.

21. The laser induced thermal imaging apparatus according to claim 1, wherein the donor film has a ribbon shape.

22. The laser induced thermal imaging apparatus according to claim 21, wherein the ribbon-shaped donor film includes protrusions at both edges thereof.

23. The laser induced thermal imaging apparatus according to claim 21, further comprising film supply means at one side of the lamination unit and film winding means at the other side of the lamination unit.

24. The laser induced thermal imaging apparatus according to claim 23, further comprising a guide roll for contacting the film on the substrate to at least one side of the lamination unit.

25. The laser induced thermal imaging apparatus according to claim 23, wherein the laser irradiator, the lamination unit, the film supply means and the film winding means are simultaneously movable in a Y-direction crossing the chuck.

26. The laser induced thermal imaging apparatus according to claim 25, wherein the laser irradiator is installed on the optical stage through a laser irradiator base, a lamination unit base is connected to the laser irradiator base, the lamination unit is installed at the lamination unit base, and the film supply means and the film winding means are spaced apart from the lamination unit and individually installed at the lamination unit base.

27. The laser induced thermal imaging apparatus according to claim 1, wherein the donor film is located on an entire surface of the acceptor substrate.

28. The laser induced thermal imaging apparatus according to claim 27, wherein at least two corners of the donor film are attached to a frame.

29. The laser induced thermal imaging apparatus according to claim 28, wherein the chuck fixes the frame.

30. The laser induced thermal imaging apparatus according to claim 1, wherein the donor film includes a base film, a light-heat conversion layer located on the base film, and a transfer layer located on the light-heat conversion layer.

31. The laser induced thermal imaging apparatus according to claim 30, wherein the transfer layer is at least one organic layer selected from a group consisting of a hole injection organic layer, a hole transport organic layer, an emissive organic layer, a hole blocking organic layer, an electron transport organic layer, and an electron injection organic layer.

32. The laser induced thermal imaging apparatus according to claim 1, wherein the acceptor substrate is an organic light emitting display substrate.

33. A laser induced thermal imaging method comprising:
locating an acceptor substrate on a chuck;
locating a donor film having at least a light-heat conversion layer and a transfer layer to make the transfer layer opposite to the acceptor substrate; and
locally laminating a portion of the donor film on the acceptor substrate using a lamination unit, and simultaneously irradiating a laser on the laminated donor film through the lamination unit to transfer at least a portion of the transfer layer on the acceptor substrate,
wherein the lamination unit includes a body having a cavity, a gas injection port for injecting a compression gas into the cavity and a gas discharge port for discharging the gas injected into the cavity onto the substrate.

34. The laser induced thermal imaging method according to claim 33, wherein the lamination unit performs a lamination process using air pressure.

35. The laser induced thermal imaging method according to claim 34, wherein the lamination unit further includes a light transmission window installed at an upper portion of the body and in contact with the cavity.

36. The laser induced thermal imaging method according to claim 35, wherein the gas injection port passes through a sidewall of the body.

37. The laser induced thermal imaging method according to claim 34, wherein the gas injection port passes through an upper portion of the body, and the gas discharge port passes through a lower portion of the body.

38. The laser induced thermal imaging method according to claim 33, wherein the lamination process and the laser irradiation process are continuously performed in a Y-direction crossing the chuck.

39. The laser induced thermal imaging method according to claim 33, wherein the lamination process is performed in a Y-direction crossing the chuck in an extended manner and the laser is irradiated along the donor film laminated in the Y-direction.

40. The laser induced thermal imaging method according to claim 33, wherein the donor film has a ribbon shape.

41. The laser induced thermal imaging method according to claim 33, wherein the donor film is located on an entire surface of the substrate.

42. The laser induced thermal imaging method according to claim 41, wherein at least two corners of the donor film are attached to a frame.

43. The laser induced thermal imaging method according to claim 42, wherein the chuck is fixed to the frame, before performing the lamination process and the laser irradiation process.

44. A method of fabricating an organic light emitting display, comprising:
locating an organic light emitting display substrate, at which a pixel electrode is formed, on a chuck;
locating a donor film having at least a light-heat conversion layer and an organic transfer layer to make the organic transfer layer opposite to the display substrate; and
locally laminating a portion of the donor film on the acceptor substrate using a lamination unit, and simultaneously irradiating a laser on the laminated donor film through the lamination unit to transfer at least a portion of the transfer layer on the display substrate to thereby form an organic functional layer on the pixel electrode,
wherein the lamination unit includes a body having a cavity, a gas injection port for injecting a compression gas into the cavity and a gas discharge port for discharging the gas injected into the cavity onto the substrate.

45. The method according to claim 44, wherein the lamination unit performs a lamination process using air pressure.

46. The method according to claim 45, wherein the lamination unit further includes a light transmission window installed at an upper portion of the body and in contact with the cavity.

47. The method according to claim 46, wherein the gas injection port passes through a sidewall of the body.

48. The method according to claim 45, wherein the gas injection port passes through an upper portion of the body, and the gas discharge port passes through a lower portion of the body.

49. The method according to claim 44, wherein the lamination process and the laser irradiation process are continuously performed in a Y-direction crossing the chuck.

50. The method according to claim 44, wherein the lamination process is performed in a Y-direction crossing the chuck in an extended manner, and the laser is irradiated along the laminated donor film in the Y-direction.

51. The method according to claim 44, wherein the donor film has a ribbon shape.

52. The method according to claim 44, wherein the donor film is located on an entire surface of the substrate.

53. The method according to claim 44, wherein the organic functional layer is at least one layer selected from a group consisting of a hole injection layer, a hole transport layer, an emission layer, a hole blocking layer, an electron transport layer, and an electron injection layer.

* * * * *